United States Patent
Yamamoto (10) Patent No.: US 7,031,535 B2
(45) Date of Patent: Apr. 18, 2006

(54) IMAGE PROCESSING APPARATUS CAPABLE OF INTERPOLATING ERROR DATA

(75) Inventor: Toshinori Yamamoto, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 752 days.

(21) Appl. No.: 10/227,199

(22) Filed: Aug. 26, 2002

(65) Prior Publication Data

US 2003/0044089 A1   Mar. 6, 2003

(30) Foreign Application Priority Data

Aug. 28, 2001   (JP)   ............................. 2001-258175

(51) Int. Cl.
  *G06K 9/36*   (2006.01)
(52) U.S. Cl. ...................... 382/240; 382/248; 382/300; 375/240.11; 375/240.19; 375/240.21; 348/398.1; 348/437.1; 348/438.1
(58) Field of Classification Search ................ 382/232, 382/240, 244, 248, 250–252, 300; 348/398, 348/398.1, 437.1, 438.1; 375/240.11, 240.18, 375/240.19, 240.21
See application file for complete search history.

(56) References Cited

U.S. PATENT DOCUMENTS

| | | | | |
|---|---|---|---|---|
| 5,048,111 A | * | 9/1991 | Jones et al. | 382/240 |
| 5,212,695 A | * | 5/1993 | Shikakura et al. | 714/759 |
| 5,243,428 A | * | 9/1993 | Challapali et al. | 348/607 |
| 5,268,961 A | * | 12/1993 | Ng | 348/425.2 |
| 5,278,915 A | * | 1/1994 | Chupeau et al. | 382/240 |
| 5,353,059 A | * | 10/1994 | Lawlor et al. | 348/607 |
| 5,600,374 A | * | 2/1997 | Shikakura | 375/240.11 |
| 5,845,041 A | * | 12/1998 | Ohkuma et al. | 386/68 |
| 5,929,913 A | * | 7/1999 | Etoh | 348/699 |
| 6,137,915 A | * | 10/2000 | Chai | 382/240 |
| 6,141,453 A | * | 10/2000 | Banham et al. | 382/240 |
| 6,295,624 B1 | * | 9/2001 | Gillard | 714/746 |

* cited by examiner

*Primary Examiner*—Bhavesh M. Mehta
*Assistant Examiner*—Manav Seth
(74) *Attorney, Agent, or Firm*—Fitzpatrick, Cella, Harper & Scinto (57) ABSTRACT

This invention provides an image processing apparatus which receives an image signal divided into a plurality of different subband components, detects an error in low-frequency subband component data within the image signal of one picture, and interpolates remaining frequency subband component data other than the low-frequency subband component of the picture in accordance with the error detection result.

28 Claims, 7 Drawing Sheets

IMAGE PROCESSING APPARATUS CAPABLE OF INTERPOLATING ERROR DATA

BACKGROUND OF THE INVENTION

1. Field of the Invention

The present invention relates to an image processing apparatus and, more particularly, to data error interpolation processing.

2. Related Background Art

Figure 6:
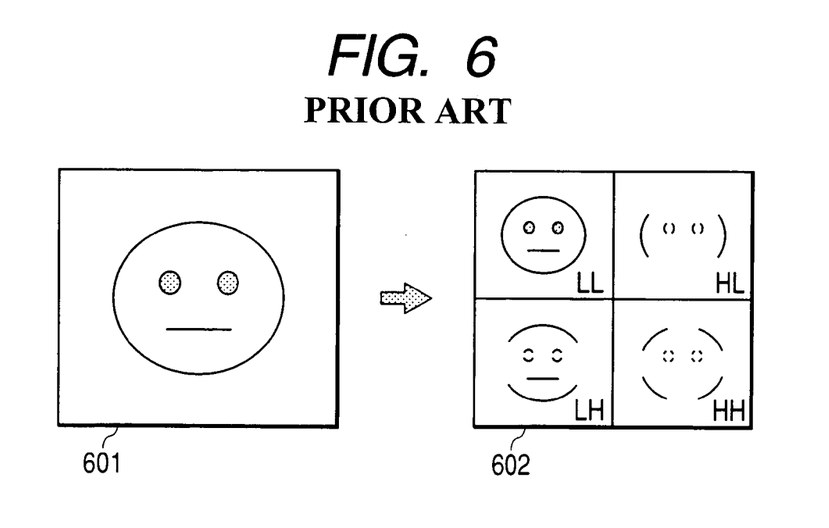
FIG. 6 is a spatial schematic view before and after two-dimensional wavelet transform.
Figure 7:
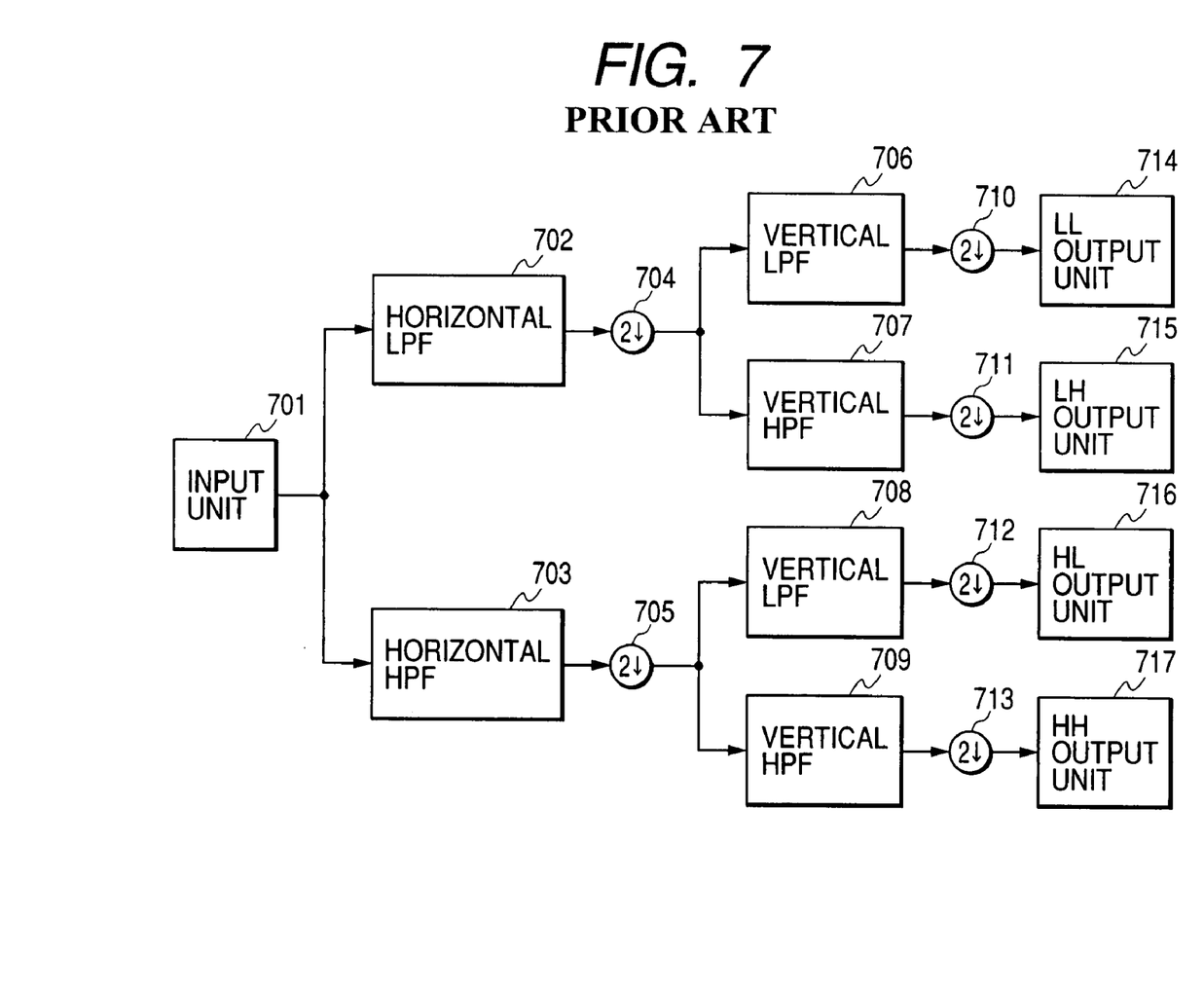
FIG. 7 is a block diagram showing a two-dimensional wavelet transform encoder.
Figure 8:
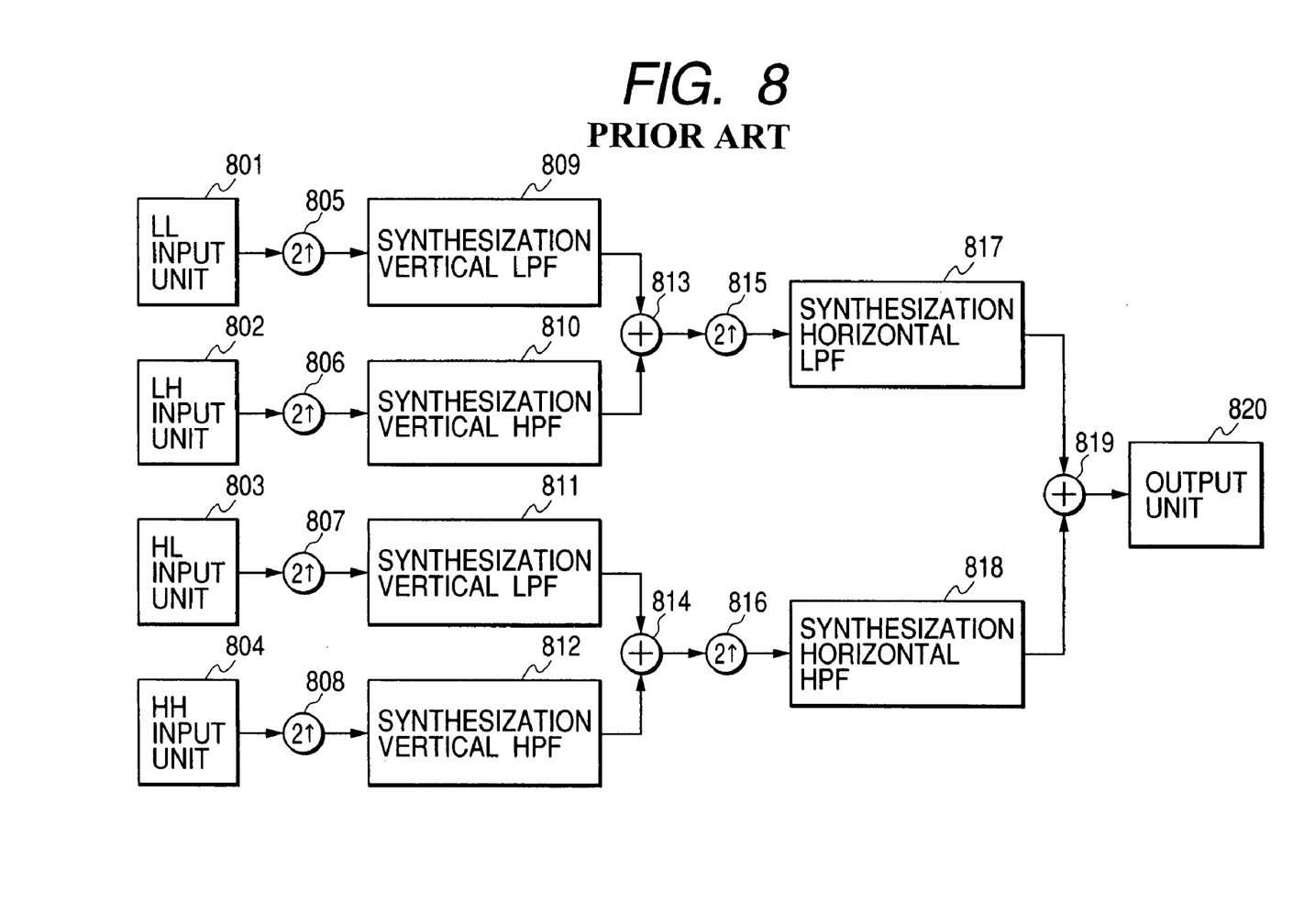
FIG. 8 is a block diagram showing a conventional two-dimensional wavelet transform decoder.

Wavelet transform processing using a subband encoding technique has conventionally been known. FIG. 7 is a block diagram showing a conventional encoder which performs two-dimensional wavelet transform. FIG. 8 is a block diagram showing a conventional decoder which decodes two-dimensionally wavelet-transformed data. FIG. 6 is a schematic view showing the space before and after the two-dimensional wavelet transform.

Two-dimensional wavelet transform performs high- and low-pass filter processes in the horizontal and vertical directions on input image data, and transforms the data into a plurality of subband components formed from data corresponding to different spatial frequency bands. For example, subband-transformed image data 602 is obtained as a result of performing wavelet transform processing on an image 601 in FIG. 6.

Data having undergone horizontal high-pass filter processing and then vertical high-pass filter processing is transformed into data corresponding to the HH area of the data 602. Data having undergone horizontal high-pass filter processing and then vertical low-pass filter processing is transformed into data corresponding to the HL area of the data 602. Data having undergone horizontal low-pass filter processing and then vertical high-pass filter processing is transformed into data corresponding to the LH area of the data 602. Data having undergone horizontal low-pass filter processing and then vertical low-pass filter processing is transformed into data corresponding to the LL area of the data 602.

For descriptive convenience, wavelet transform of level 1 has been explained. It is also possible to perform wavelet transform of level 2 which executes high- and low-pass filter processes in the horizontal and vertical directions on data of the LL area of the data 602 and transforms the data into a subband, or wavelet transform of level 3 which executes high- and low-pass filter processes in the horizontal and vertical directions on data of the LL area having undergone wavelet transform of level 2 and transforms the data into a subband.

In practice, wavelet transform is performed to a feasible level, thus implementing hardware. A two-stage processing method using a primary filter as shown in FIG. 7 is generally adopted when two-dimensional wavelet transform is to be done as hardware.

In FIG. 7, image data input from an input unit 701 is output to two horizontal filters. One horizontal filter is a horizontal low-pass filter 702, and the other is a horizontal high-pass filter 703. Data processed by the horizontal LPF 702 and horizontal HPF 703 are respectively output to down-samplers 704 and 705. The down-samplers 704 and 705 thin out input image data every other sample to halve the data amount.

The respective data having undergone the two types of horizontal filter processes is then subjected to vertical filter processing.

This filter processing is done by four filters: a vertical LPF 706 for data having passed through the horizontal LPF 702, a vertical HPF 707 for data having passed through the horizontal LPF 702, a vertical LPF 708 for data having passed through the horizontal HPF 703, and a vertical HPF 709 for data having passed through the horizontal HPF 703. Data processed by the vertical filters are thinned out to ½ the data amount by down-samplers 710, 711, 712, and 713.

In this manner, input image data is divided into four subband components, i.e., LL, LH, HL, and HH data. The four subband components are output from LL, LH, HL, and HH output units 714, 715, 716, and 717. The output data are transmitted through a radio communication channel, wire communication path, or recording medium.

FIG. 8 is a block diagram showing a decoder which decodes, into original image data, data which has undergone two-dimensional wavelet transform processing and is transmitted through a transmission path.

Subband component data input to LL, LH, HL, and HH input units 801, 802, 803, and 804 are output to vertical up-samplers 805, 806, 807, and 808. The up-samplers 805 to 808 insert zero data between two samples of input data to double the number of samples.

After up-sampling processing, LL, LH, HL, and HH components are respectively output to a synthesization vertical LPF 809, synthesization vertical HPF 810, synthesization vertical LPF 811, and synthesization vertical HPF 812. The synthesization vertical LPF 809, synthesization vertical HPF 810, synthesization vertical LPF 811, and synthesization vertical HPF 812 filter the input data, and synthesize samples corresponding to zero data inserted by the up-samplers 805 to 808. Outputs from the synthesization vertical LPF 809 and synthesization vertical HPF 810 are output to an adder 813, whereas outputs from the synthesization vertical LPF 811 and synthesization vertical HPF 812 are output to an adder 814. The adders 813 and 814 add data from these filters to synthesize the vertical components.

Outputs from the adders 813 and 814 are output to horizontal up-samplers 815 and 816. The up-samplers 815 and 816 insert zero data between two samples to double the number of samples. LL and LH components are output to a synthesization horizontal LPF 817, and HL and HH components are output to a synthesization horizontal HPF 818. The synthesization horizontal LPF 817 and synthesization horizontal HPF 818 filter the input data, and synthesize samples corresponding to zero data inserted by the up-samplers 815 and 816. Outputs from the synthesization horizontal LPF 817 and synthesization horizontal HPF 818 are added by an adder 819 to synthesize the horizontal components. The data is decoded into original image data, which is output from an output unit 820.

SUMMARY OF THE INVENTION

When data having undergone wavelet transform processing is transmitted through a transmission path, an error may occur in the data depending on the state of the transmission path.

The conventional method does not execute any interpolation processing on each subband component data in decoding. Especially when an error occurs in low-frequency LL component data, it is almost impossible to reconstruct an original image.

It is an object of the present invention to solve the conventional drawbacks.

It is another object of the present invention to prevent image degradation by performing effective interpolation when image data divided into a plurality of subband components is decoded.

To achieve the above objects, according to an aspect of the present invention, there is provided an image processing apparatus comprising:

input means for inputting an image signal divided into a plurality of different subband components;

error detection means for detecting an error in low-frequency subband componenet data of the image signal of one picture; and interpolation means for interpolating remaining frequency subband component data other than the low-frequency subband component of the one picture in accordance with an error detection result of the error detection means.

The above and other objects and features of the present invention will be apparent from the following detailed description of the preferred embodiments in conjunction with the accompanying drawings.

DESCRIPTION OF THE PREFERRED EMBODIMENTS

Preferred embodiments of the present invention will be described below.

Figure 1:
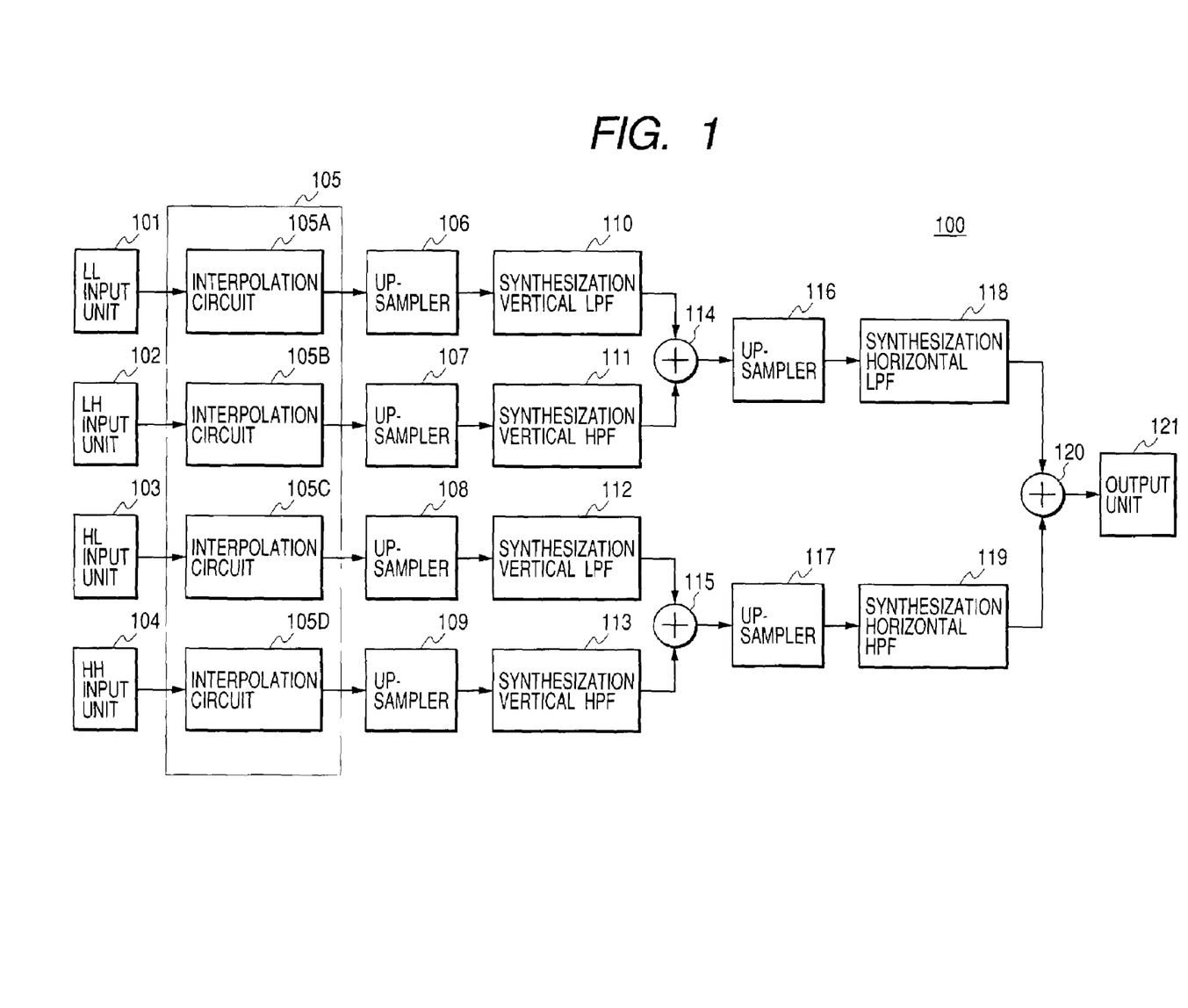
FIG. 1 is a block diagram showing a two-dimensional wavelet transform decoder apparatus according to an embodiment of the present invention.

FIG. 1 is a block diagram showing the arrangement of a decoder 100 to which the present invention is applied.

The decoder in FIG. 1 is an apparatus which receives, via a transmission path, data having undergone two-dimensional wavelet transform processing by an encoder shown in FIG. 7 and processes the data.

In FIG. 1, LL, LH, HL, and HH input units 101, 102, 103, and 104 receive LL, LH, HL, and HH components of data having undergone wavelet transform processing, and output these components to an interpolation unit 105 made up of interpolation circuits 105A to 105D. The interpolation unit 105 detects an error in each input subband component data, and interpolates the error data. The processing of the interpolation unit 105 will be described later.

Respective subband component data interpolated by the interpolation circuits 105A to 105D are output to up-samplers 106 to 109. Similar to the up-samplers 805 to 808 in FIG. 8, the up-samplers 106 to 109 insert zero data between two samples of input data to double the number of samples. Outputs from the up-samplers 106 to 109 are respectively output to a synthesization vertical LPF 110, synthesization vertical HPF 111, synthesization vertical LPF 112, and synthesization vertical HPF 113.

The synthesization vertical LPF 110, synthesization vertical HPF 111, synthesization vertical LPF 112, and synthesization vertical HPF 113 filter input data, and synthesize samples corresponding to zero data inserted by the up-samplers 106 to 109. Outputs from the synthesization vertical LPF 110 and synthesization vertical HPF 111 are output to an adder 114, while outputs from the synthesization vertical LPF 112 and synthesization vertical HPF 113 are output to an adder 115. The adders 114 and 115 add data from these filters to synthesize the vertical components.

Outputs from the adders 114 and 115 are output to horizontal up-samplers 116 and 117. The up-samplers 116 and 117 insert zero data between two samples to double the number of samples. LL and LH components are output to a synthesization horizontal LPF 118, and HL and HH components are output to a synthesization horizontal HPF 119. The synthesization horizontal LPF 118 and synthesization horizontal HPF 119 filter the input data, and synthesize samples corresponding to zero data inserted by the up-samplers 116 and 117. The synthesization horizontal LPF 118 and synthesization horizontal HPF 119 output the thus-processed data to an adder 120. The adder 120 adds the horizontal subband components output from the synthesization horizontal LPF 118 and synthesization horizontal HPF 119 to be decoded into original image data and then output from an output unit 121.

The processing of the interpolation unit 105 will be explained. The first embodiment performs interpolation processing on each input subband component data before vertical up-sampling processing.

Figure 2:
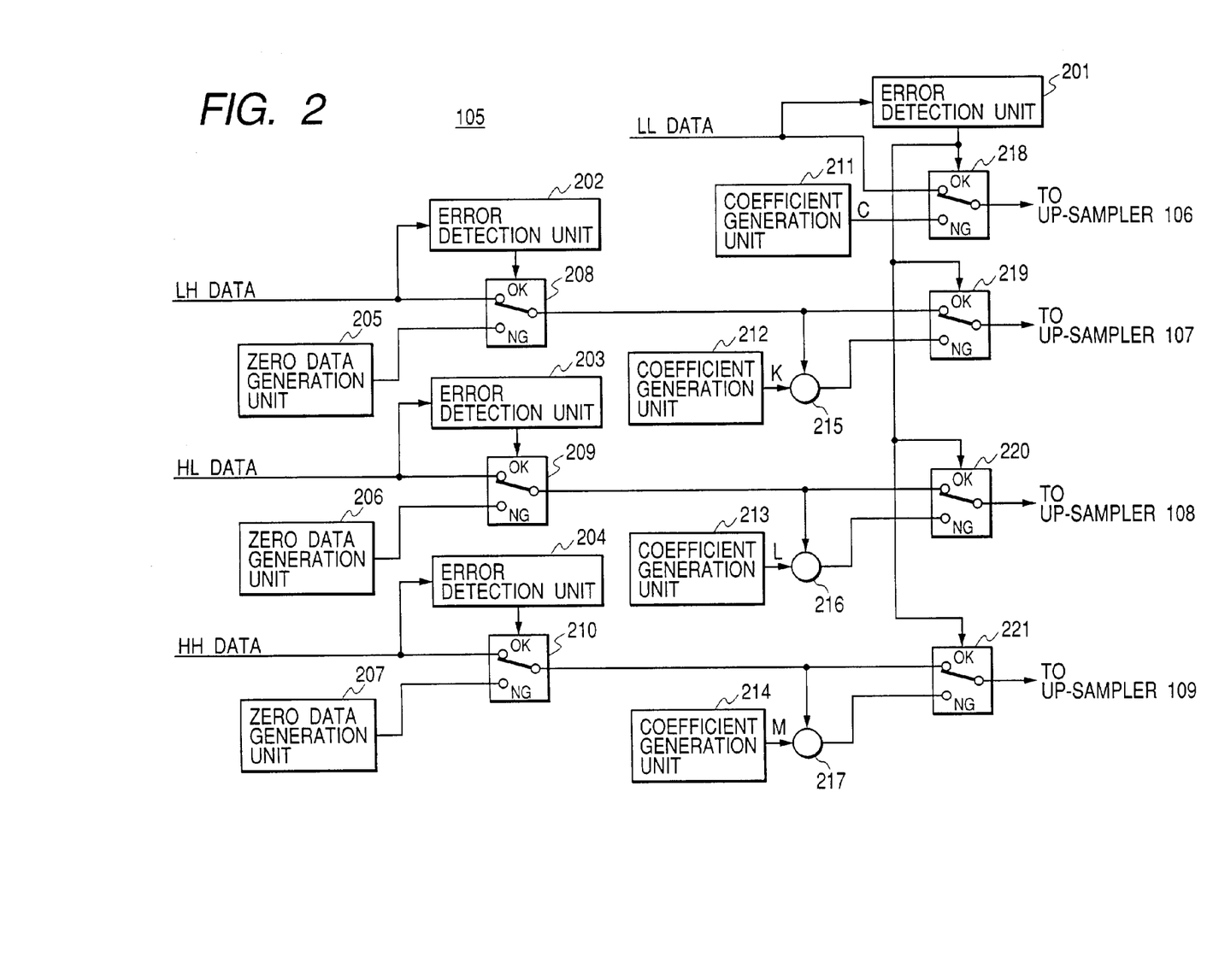
FIG. 2 is a block diagram showing the arrangement of an interpolation unit according to the embodiment of the present invention.

FIG. 2 is a block diagram showing the arrangement of the interpolation unit 105.

In FIG. 2, LH, HL, and HH component data are output to error detection units 202, 203, and 204 and switches 208, 209, and 210. The error detection units 202, 203, and 204 detect errors in LH, HL, and HH component subband data. The switches 208, 209, and 210 are switched in accordance with error detection results to determine whether to interpolate subband component data having LH, HL, and HH components.

In the first embodiment, transmitted data has undergone error correction encoding by a known error correction encoding technique. Each error detection unit performs error correction and error detection on each subband.

For example, for an LH component, the error detection unit 202 checks an error contained in LH component coefficient data of image data of one picture. If the error detection unit 202 determines the presence of an error, the switch 208 is switched to the NG side, and the LH component coefficient data in one picture is interpolated by zero data from a zero data generation unit. More specifically, when even one error exists in the block of an LH component 602 in FIG. 6, the LH component block is entirely replaced by zero data.

The high-frequency component of an image has an edge enhancement function. If the edges of LL and LH components in the picture shift from each other, the image seems double, resulting in a visually blurred image. To prevent such a blurred image, LH component error data is interpolated by zero data. Based on this concept, the first embodiment replaces all error data by zero when errors are detected in subband coefficient data for LH, HL, and HH components, which are high-frequency components. For this purpose, HL, HH, and LH components have the same block structure.

If the error detection unit determines the absence of any error as a result of checking an error contained in LH component coefficient data, the switch 208 is switched to the OK side, and data is directly output. As for HL and HH components, similar to the LH component, data are directly output in the absence of any error.

Processing for LL component coefficient data will be explained.

When an error is detected in an LL component, the first embodiment interpolates the error in the LL component. At the same time, interpolation processing is done for LH, HL, and HH components to make the error as visually inconspicuous as possible.

LL component data input from the LL input unit 101 is output to an error detection unit 201 and switch 218. The error detection unit 201 detects error data in LL component subband coefficient data. The switch 218 is switched in accordance with the result to determine whether to perform interpolation processing.

For example, if the error detection unit 201 determines the presence of an error as a result of checking an error contained in LL component coefficient data, the switch 218 is connected to the NG side. All LL component coefficient data within one picture are interpolated by a predetermined value C output from a coefficient generation unit 211. The predetermined value C is a value representing gray. The first embodiment achieves interpolation by replacing all LL components by a predetermined value. This is an interpolation method which aims to make an error visually inconspicuous on the picture in harmony with high-frequency component enhancement.

If the error detection unit 201 determines the absence of any error as a result of checking an error contained in coefficient data, the switch 218 is connected to the OK side, and LL component coefficient data is output without a change.

Interpolation processing for LH, HL, and HH component coefficient data executed when an error is detected in LL component coefficient data will be described.

The first embodiment interpolates LH, HL, and HH components while interpolating an LL component, thereby making an error as visually inconspicuous as possible.

For example for an LH component, the error detection unit 201 checks an error contained in LL component coefficient data. If the presence of an error is determined, a switch 219 is connected to the NG side in synchronism with the switch 218. The LH component coefficient data from the switch 208 is replaced by a value calculated by multiplying by a multiplier 215 the LH component coefficient data output from the switch 208 by a predetermined coefficient K from a coefficient generation unit 212. In this way, the LH component coefficient data is interpolated. The predetermined coefficient K is an enhancement coefficient of 1 or more.

In decoding wavelet-transformed data, an image can be reconstructed to a recognizable image by using only a high-frequency component coefficient without using any low-frequency component (LL component) out of subband-divided data. With only the high-frequency component, however, the gain of the reconstructed image becomes flat, resulting in a visually low-contrast image. In the first embodiment, an LL component is replaced by the predetermined value C when an error occurs in the LL component. An original image is reconstructed without using any LL component. In this case, a value prepared by multiplying LH component coefficient data by the enhancement coefficient K of 1 or more by the switch 219 is selected and output instead of directly using LH component coefficient data.

An error generated in LL component coefficient data damages a DC component serving as the fundamentals of an image. If data containing the error undergoes inverse wavelet transform without any interpolation, the image becomes different from the original one.

To prevent this, the first embodiment replaces LL component data by the coefficient C having a value corresponding to inconspicuous gray, and multiplies LH component coefficient data by the enhancement coefficient K of 1 or more. An original image can be reconstructed at a given level or higher with a simple arrangement although the image is somewhat visually flat.

If the error detection unit 201 determines the absence of any error as a result of error check, the switch 219 is connected to the NG side, and LH component coefficient data output from the switch 208 is directly output.

Interpolation processing for LH component coefficient data that is executed when an error is detected in LL component coefficient data has been described. Interpolation processing is similarly performed for an HL or HH component.

However, the enhancement coefficient K is a value which complies with an LH component. For HL and HH components, enhancement coefficients L and M different from K are used in accordance with subband characteristics. Similar to the enhancement coefficient K, the enhancement coefficient L is a predetermined value of 1 or more. As the enhancement coefficient L, a value exhibiting the highest visual effect for a subband HL component when an LL component is interpolated by the predetermined value C is selected. The enhancement coefficient M is also a predetermined value of 1 or more, similar to the enhancement coefficient K. As the enhancement coefficient M, a value exhibiting the highest visual effect for a subband HH component when an LL component is interpolated by the predetermined value C is selected.

As described above, according to the first embodiment, error data is detected every subband component in decoding wavelet-transformed image data. If an error is detected, interpolation is done by replacing all subband components by another data. For example, an LL component is replaced by data having a predetermined value representing visually inconspicuous gray or the like, and another component is replaced by zero data. Even upon occurrence of an error, image degradation can be suppressed.

When an error is detected in a low-frequency component (LL component), interpolation processing of transforming the remaining components (LH, HL, and HH components) into data calculated by multiplying the respective component data by predetermined coefficients so as to enhance high frequencies is further executed in accordance with detection of the LL component error. Even if an LL component as a fundamental picture component is interpolated by a predetermined value, the image can be reconstructed to an original one to a certain degree.

In the first embodiment, when errors are detected in subband coefficient data for LH, HL, and HH components as high-frequency components, interpolation is achieved by replacing all the data by zero data. The LH, HL, and HH components can also be replaced by an effective value in place of zero data. Alternatively, the LH, HL, and HH components can also be replaced by different values.

When an error is detected in LL component, subband coefficient data, LH, HL, and HH component coefficient data are replaced by values obtained by multiplying these coefficient data by the coefficients K, L, and M. Instead of the three coefficients, a single coefficient can be used to simplify the circuit.

The first embodiment has exemplified wavelet transform of level 1. Data repetitively divided into subbands can also be processed, like wavelet transform of level 2 in which LL component data is transformed into subbands through HPFs and LPFs in the horizontal and vertical directions, or wavelet transform of level 3 in which LL component data having undergone wavelet transform of level 2 is transformed into subbands through HPFs and LPFs in the horizontal and vertical directions.

In the arrangement of FIG. 2, the error detection units which detect errors in respective subband components are independently arranged. The zero data generation units are also independently arranged for LH, HL, and HH components. The error detection units can be implemented by one unit, while the zero data generation units can be implemented by one unit.

Figure 3:
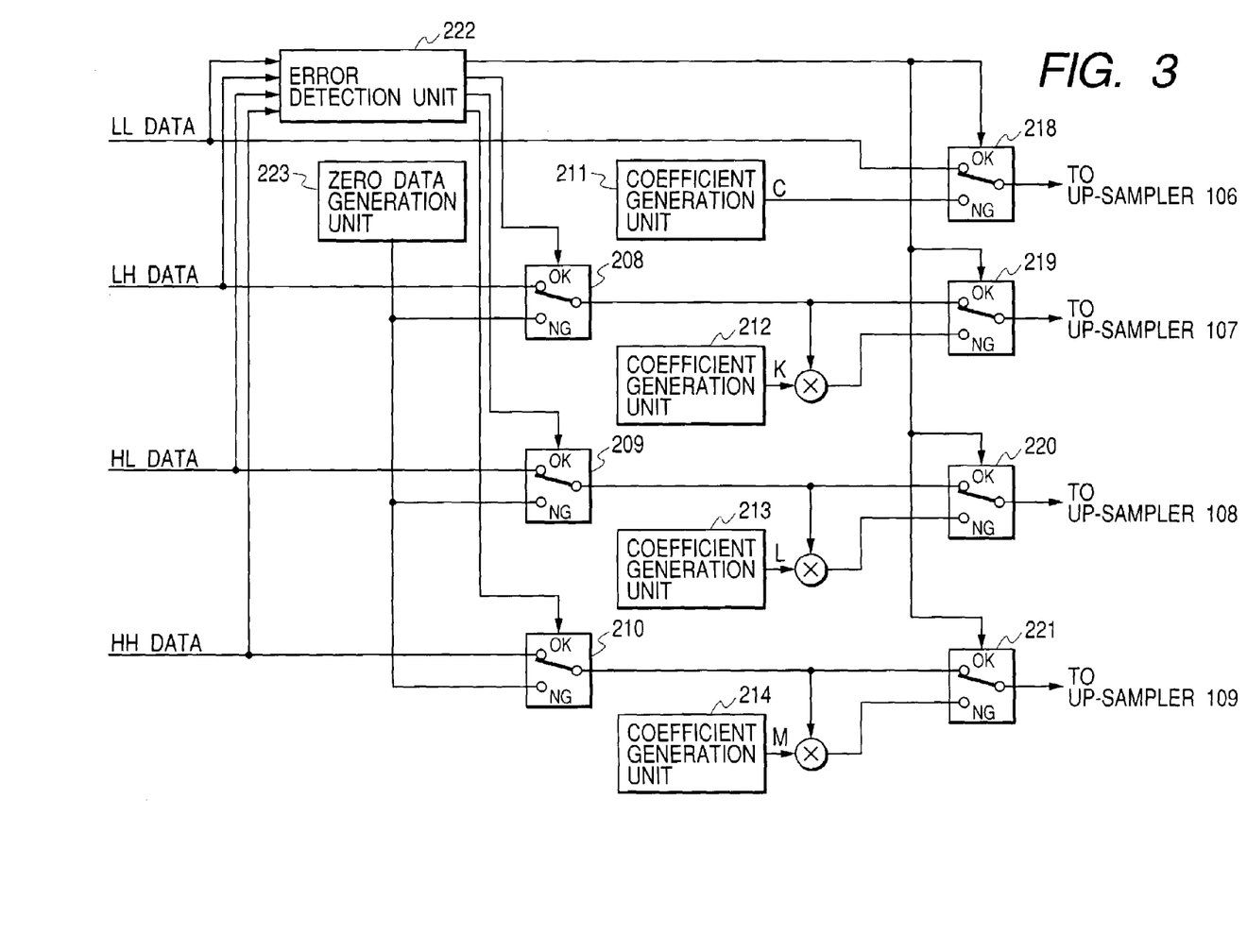
FIG. 3 is a block diagram showing another arrangement of the interpolation unit according to the embodiment of the present invention.

That is, as shown in FIG. 3, an error detection unit 222 and zero data generation unit 223 are arranged. The error detection unit 222 detects errors in respective components, controls the switches 208 to 210 on the basis of the error detection results of LH, HL, and HH components, and controls switches 218 to 221 on the basis of the error detection result of an LL component. Zero data from the zero data generation unit 223 is output to the switches 208 to 210.

The second embodiment will be described.

Figure 4:
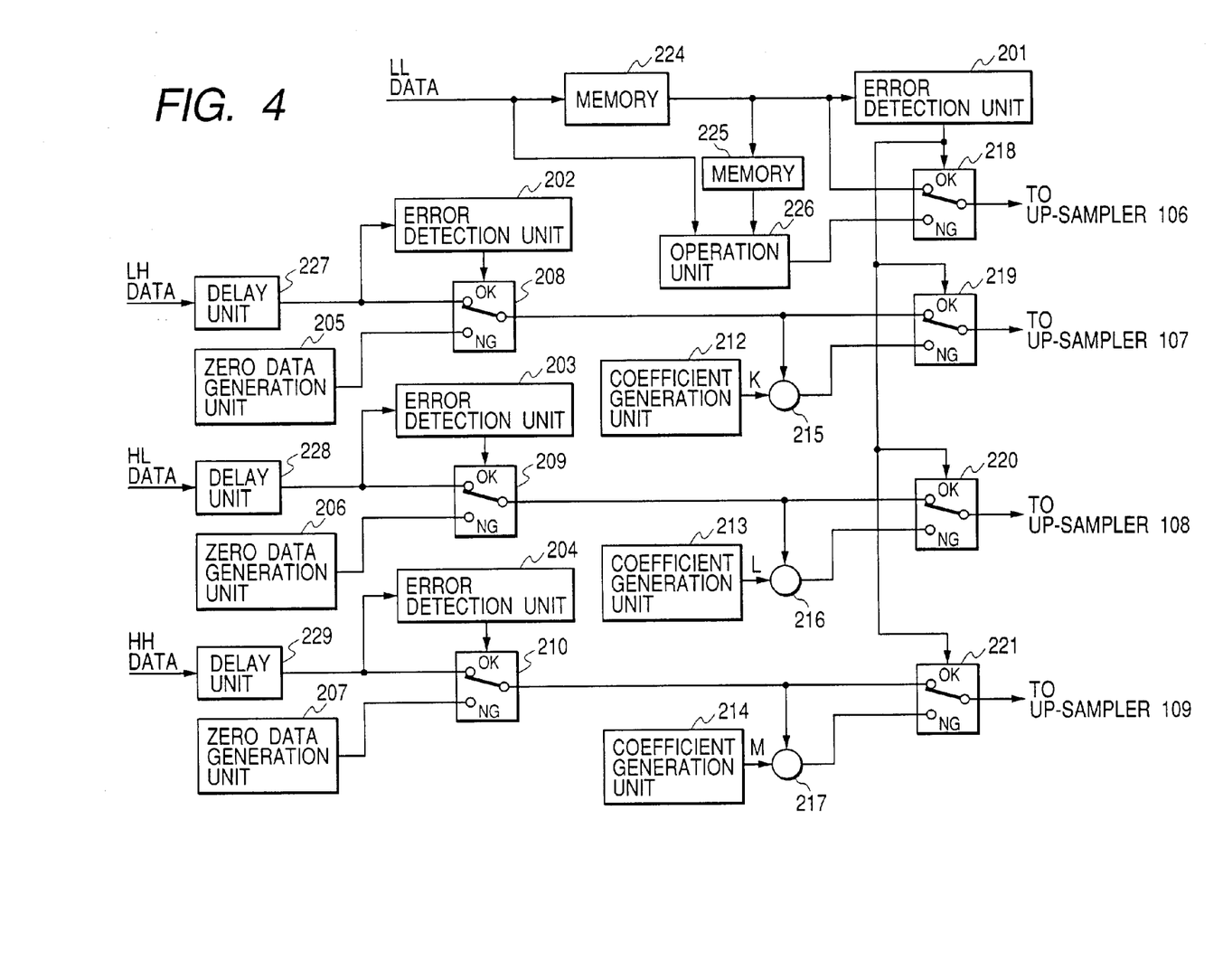
FIG. 4 is a block diagram showing still another arrangement of the interpolation unit according to the embodiment of the present invention.

FIG. 4 is a block diagram showing the arrangement of an interpolation unit 105 according to the second embodiment of the present invention. In FIG. 4, the same reference numerals as in FIG. 2 denote the same parts.

In FIG. 4, input LH, HL, and HH component data are delayed by one frame period by delay units 227, 228, and 229, and output to error detection units 202 to 204 and switches 208 to 210. Interpolation processing of respective subband coefficient data when the error detection units 202 to 204 detect errors in subband component coefficient data for LH, HL, and HH components, and processing when no error is detected are the same as those described in the first embodiment, and a description thereof will be omitted.

Interpolation processing when an error is detected in LL component coefficient data will be explained.

LL component data is output to an error detection unit 201 via a memory 224. The error detection unit 201 checks an error in the LL component data, switches a switch 218 based on the result, and determines whether to interpolate the LL component data. If an error is detected, the switch 218 is connected to the NG side, and all LL component data are replaced by interpolation data from an operation unit to interpolate the LL component data.

An operation unit 226 receives input LL component data, and LL component data via the memory 224 and a memory 225. The memories 224 and 225 delay input LL component data by one frame period, and output the data. The operation unit 226 receives LL component data of adjacent frames before and after LL component data output to the error detection unit 201.

The operation unit 226 calculates the average of LL component data of preceding and subsequent adjacent frames input in the above manner. The operation unit 226 outputs the average as interpolation data to the switch 218.

Figure 5:
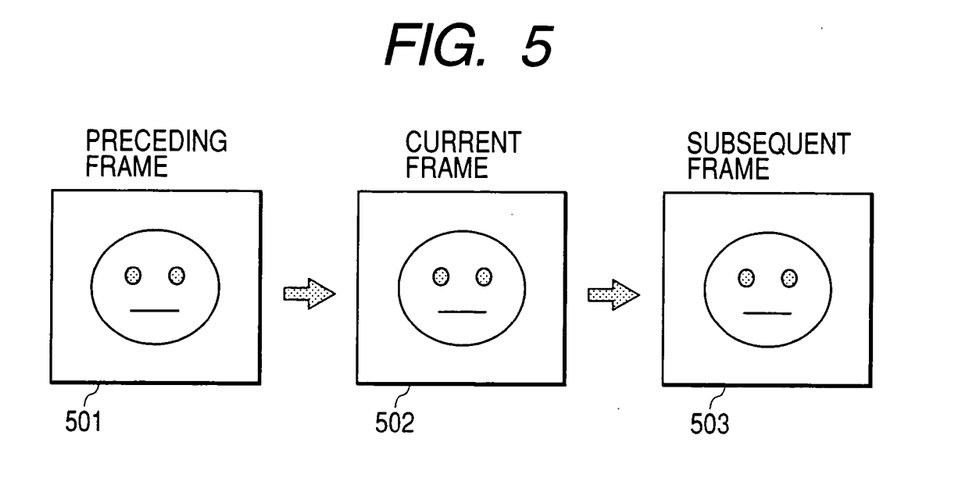
FIG. 5 is a spatial schematic view showing a two-dimensionally wavelet-transformed LL subband component.

FIG. 5 is a spatial schematic view showing LL component data. A frame 502 is undergoing interpolation processing. A frame 501 immediately precedes the current frame. A frame 503 is immediately subsequent to the current frame.

As is apparent from FIG. 5, a wavelet-transformed LL component has a very strong correlation between frames, and the LL component values of adjacent frames are almost equal. The second embodiment adopts this wavelet transform characteristic.

More specifically, the operation unit 226 calculates the average of LL component data of a subsequent frame output to the memory 224 and LL component data of a preceding frame output from the memory 225. The average is set as an interpolation value of LL component data of the current frame.

When the error detection unit 201 determines the absence of any error, the switch 218 is connected to the OK side, and LL component data from the memory 224 is directly output.

The delay units 227, 228, and 229 are arranged in FIG. 4 in order to synchronize the processing timings of LH, HL, and HH data with that of LL data because LL data is delayed by one frame by the memory 224 to generate interpolation data for LL data.

A method of interpolating LH, HL, and HH components with respective coefficient data when an error is detected in LL component data, and processing executed when no error is detected in LL component data are the same as those described in the first embodiment, and a description thereof will be omitted.

When an error occurs in an LL component, the second embodiment interpolates the LL component with the average of LL component data of preceding and subsequent frames. Hence, an interpolated image almost close to an original image can be obtained even if LL data contains an error.

In the second embodiment, the average of frames before and after the current frame is used as an LL component interpolation value. This embodiment can also adopt an arrangement in which LL component data is replaced by LL component data of a preceding frame, an arrangement in which LL component data is replaced by LL component data of a subsequent frame, or an arrangement in which LL component data is interpolated by the average of LL component data of preceding or subsequent successive frames.

The characteristic features of the above-described embodiments of the present invention are as follows.

(1) There are provided an image signal processing apparatus characterized by comprising a means for selecting whether to replace error data in subband component coefficient data by interpolation data in accordance with the error detection result of the subband component coefficient data, and an image signal processing method.

According to these apparatus and method, interpolation processing can be performed on each divided subband frequency component.

(2) There are provided an image signal processing apparatus characterized by comprising a means for, when an error is detected in each subband component coefficient data, replacing error data in the subband component coefficient data with a predetermined value to interpolate the subband component coefficient data, and an image signal processing method.

This interpolation circuit can be simplified to eliminate any complicated interpolation operation.

(3) There are provided an image signal processing apparatus characterized by comprising a means for, when an error is detected in each subband component coefficient data, replacing error data in the subband component coefficient data with a predetermined value set for each subband component in advance, thereby interpolating the subband component coefficient data, and an image signal processing method.

This enables fine interpolation processing in accordance with each frequency component.

(4) There are provided an image signal processing apparatus characterized by comprising a means for, when an error is detected in subband component coefficient data for a high-frequency (LH, HL, or HH) component, replacing error data in the subband component coefficient data with zero data, thereby interpolating the subband component coefficient data, and an image signal processing method.

The present invention can prevent the phenomenon that an image seems double, resulting in a visually blurred image when the edge of the low-frequency (LL) component of a frame and the edge of an interpolated high-frequency component shift from each other.

(5) There are provided an image signal processing apparatus characterized by comprising a means for, when an error is detected in subband component coefficient data for a low-frequency (LL) component, replacing error data in the subband component coefficient data of the LL component with LL component data of an adjacent frame or the average of LL component data of adjacent frames, thereby interpolating the subband component coefficient data, and an image signal processing method.

Accordingly, an interpolated image almost free from image degradation can be obtained using the frame successiveness of a moving image.

(6) There are provided an image signal processing apparatus characterized by comprising a means for, when an error is detected in LL component data, interpolating error data in the LL component data, and interpolating subband component coefficient data of LH, HL, and HH components with data calculated by multiplying, by a predetermined value, subband component coefficient data of the LH, HL, and HH components, and an image signal processing method.

The present invention can realize a new interpolation/adjustment method of interpolating an error in a low-frequency component by using another frequency component data.

(7) There are provided an image signal processing apparatus and method characterized by, when an error is detected in LL component data, interpolating the error in the LL component data, and replacing LH, HL, and HH subband components with values calculated by multiplying, by predetermined values of 1 or higher set for the respective subband components, subband component coefficient data for the LH, HL, and HH components.

An original image can be reconstructed at a given level or higher with a simple arrangement though the image is visually flat.

In the embodiments of the present invention, a wavelet transform coefficient (subband coefficient) of image data is interpolated. The operation amount necessary for interpolation can be decreased, and the memory amount necessary for interpolation operation can also be decreased. Fine interpolation for each image frequency component can be freely executed, which is very effective for tuning a reconstruction image.

The above embodiments can also be implemented by executing a program by a computer. A means for supplying a program to a computer, such as a recording medium including a CD-ROM which records the program or a transmission medium including the Internet which transmits the program can also be applied as another embodiment of the present invention. The program, recording medium, and transmission medium fall within the scope of the present invention. The recording medium includes, e.g., a flexible disk, a hard disk, an optical disk, a magneto-optical disk, a CD-ROM, a magnetic tape, a nonvolatile memory card, and an ROM.

The above-described embodiments are merely examples for practicing the present invention, and do not limit the technical range of the present invention. That is, the present invention can be variously modified without departing from the spirit and scope of the invention.

What is claimed is:

1. An image processing apparatus comprising:
   input means for inputting an image signal divided into a plurality of different subband components;
   error detection means for detecting an error in low-frequency subband component data of the image signal of one picture; and
   interpolation means for interpolating remaining frequency subband component data other than the low-frequency subband component of said one picture in accordance with an error detection result of said error detection means.

2. An apparatus according to claim 1, wherein said interpolation means interpolates said remaining frequency subband component data by using a predetermined coefficient.

3. An apparatus according to claim 2, wherein said interpolation means interpolates said remaining frequency subband component data by calculating said remaining frequency subband component data and the predetermined coefficient.

4. An apparatus according to claim 3, wherein the predetermined coefficient has a value different for each of the remaining frequency subband components.

5. An apparatus according to claim 3, wherein said interpolation means interpolates said remaining frequency subband component data by multiplying said remaining frequency subband component data by the predetermined coefficient.

6. An apparatus according to claim 1, wherein said interpolation means interpolates all remaining frequency subband component data of one picture.

7. An apparatus according to claim 1, wherein said error detection means further detects an error in said remaining frequency subband component data, and said interpolation means replaces said remaining frequency subband component data with a predetermined value in accordance with an error detection result of said remaining frequency subband component data.

8. An apparatus according to claim 1, wherein said interpolation means further interpolates the low-frequency subband component data in accordance with the error detection result of said error detection means.

9. An apparatus according to claim 8, wherein said interpolation means interpolates the low-frequency subband component data by replacing the low-frequency subband component data with a predetermined value.

10. An apparatus according to claim 8, wherein said interpolation means replaces all low-frequency subband component data of said one picture with a predetermined value.

11. An apparatus according to claim 8, wherein said interpolation means interpolates the detected error by using low-frequency subband component data of frames adjacent to a frame containing the error.

12. An apparatus according to claim 11, wherein said interpolation means calculates an average of low-frequency subband component data of two adjacent frames before and after the frame containing the error, and replaces the detected error with the average.

13. An apparatus according to claim 1, wherein the plurality of subband components include subband components in horizontal and vertical directions of the picture.

14. An image processing apparatus comprising:
input means for inputting an image signal divided into a plurality of different subband components;
first error detection means for detecting an error in remaining frequency subband component data other than low-frequency subband component data of the image signal of one picture;
selection means for selecting and outputting one of said remaining frequency subband component data and a predetermined value in accordance with an output from said first error detection means;
second error detection means for detecting an error in the low-frequency subband component data of said one picture; and
interpolation means for interpolating the low-frequency subband component data in accordance with detection of the error by said second error detection means, and transforming an output from said selection means into remaining data.

15. An image processing method comprising:
an input step of inputting an image signal divided into a plurality of different subband components;
an error detection step of detecting an error in low-frequency subband component data of the image signal of one picture; and
an interpolation step of interpolating remaining frequency subband component data other than the low-frequency subband component of said one picture in accordance with an error detection result in said error detection step.

16. A method according to claim 15, wherein said interpolation step interpolates said remaining frequency subband component data by using a predetermined coefficient.

17. A method according to claim 16, wherein said interpolation step interpolates said remaining frequency subband component data by calculating said remaining frequency subband component data and the predetermined coefficient.

18. A method according to claim 17, wherein the predetermined coefficient has a value different for each of the remaining frequency subband components.

19. A method according to claim 17, wherein said interpolation step interpolates said remaining frequency subband component data by multiplying said remaining frequency subband component data by the predetermined coefficient.

20. A method according to claim 15, wherein said interpolation step interpolates all remaining frequency subband component data of one picture.

21. A method according to claim 15, wherein said error detection step further detects an error in said remaining frequency subband component data, and said interpolation step replaces said remaining frequency subband component data with a predetermined value in accordance with an error detection result of said remaining frequency subband component data.

22. A method according to claim 15, wherein said interpolation step further interpolates the low-frequency subband component data in accordance with the error detection result in said error detection step.

23. A method according to claim 22, wherein said interpolation step interpolates the low-frequency subband component data by replacing the low-frequency subband component data with a predetermined value.

24. A method according to claim 23, wherein said interpolation step replaces all low-frequency subband component data of said one picture with a predetermined value.

25. A method according to claim 23, wherein said interpolation step interpolates the detected error by using low-frequency subband component data of frames adjacent to a frame containing the error.

26. A method according to claim 25, wherein said interpolation step calculates an average of low-frequency subband component data of two adjacent frames before and after the frame containing the error, and replaces the detected error with the average.

27. A method according to claim 15, wherein the plurality of subband components include subband components in horizontal and vertical directions of the picture.

28. An image processing method comprising:
an input step of inputting an image signal divided into a plurality of different subband components;
a first error detection step of detecting an error in remaining frequency subband component data other than low-frequency subband component data of the image signal of one picture;
a selection step of selecting and outputting one of said remaining frequency subband component data and a predetermined value in accordance with an output of said first error detection step;
a second error detection step of detecting an error in the low-frequency subband component data of said one picture; and
an interpolation step of interpolating the low-frequency subband component data in accordance with detection of the error in said second error detection step, and transforming an output of said selection step into remaining data.

* * * * *